United States Patent [19]
Ishinaga

[11] Patent Number: 5,760,422
[45] Date of Patent: Jun. 2, 1998

[54] LIGHT-EMITTING DIODE CHIP AND LIGHT-EMITTING DIODE USING THE SAME

[75] Inventor: Hiroki Ishinaga, Kyoto, Japan

[73] Assignee: Rohm Co., Ltd., Kyoto, Japan

[21] Appl. No.: 776,522

[22] PCT Filed: Jun. 20, 1996

[86] PCT No.: PCT/JP96/01710

§ 371 Date: Feb. 4, 1997

§ 102(e) Date: Feb. 4, 1997

[87] PCT Pub. No.: WO97/01190

PCT Pub. Date: Jan. 9, 1997

[30] Foreign Application Priority Data

Jun. 21, 1995 [JP] Japan .................. 7-154494

[51] Int. Cl.$^6$ ........................... H01L 33/00
[52] U.S. Cl. ................... 257/94; 257/96; 257/97; 257/99; 257/103; 372/43; 372/44; 372/46
[58] Field of Search ............... 257/94, 96, 97, 257/103, 99; 372/44, 45, 43, 46

[56] References Cited

U.S. PATENT DOCUMENTS

| | | | |
|---|---|---|---|
| 5,048,035 | 9/1991 | Sugawara et al. | 372/45 |
| 5,153,889 | 10/1992 | Sugawara et al. | 372/45 |
| 5,228,044 | 7/1993 | Ohba | 372/45 |
| 5,404,031 | 4/1995 | Sasaki et al. | 372/45 X |
| 5,488,233 | 1/1996 | Ishikawa et al. | 372/45 X |
| 5,621,225 | 4/1997 | Shieh et al. | 257/88 X |

FOREIGN PATENT DOCUMENTS

| | | |
|---|---|---|
| 4-212479 | 8/1992 | Japan . |
| 4-361572 | 12/1992 | Japan . |
| 6-326360 | 11/1994 | Japan . |
| 7-86638 | 3/1995 | Japan . |

*Primary Examiner*—William Mintel
*Attorney, Agent, or Firm*—Nikaido, Marmelstein, Murray & Oram LLP

[57] ABSTRACT

An InGaAlP-type light-emitting diode chip (1) includes a plurality of material layers (2-6) in lamination. The chip has a rectangular surface perpendicular to the laminating direction of the material layers (2-6). Each side of the rectangular surface is no greater than 0.25 mm in length. A light-emitting diode is arranged to include the light-emitting diode chip (1) and, when driven by a forward current of 2-5 mA for light emission, can provide the same luminance as a conventional light-emitting diode driven by a forward current of about 25 mA for light emission.

11 Claims, 6 Drawing Sheets

Fig. 6

Current Density (mA/mm²)

| Electric Current (mA) | Chip Size | | | |
|---|---|---|---|---|
| | 0.32 | 0.25 | 0.17 | 0.11 |
| 30.00 | 293.0 | 480.0 | 1038.1 | 2479.3 |
| 25.00 | 244.0 | 400.0 | 865.1 | 2066.1 |
| 20.00 | 195.0 | 320.0 | 692.0 | 1652.9 |
| 10.00 | 97.7 | 160.0 | 346.0 | 826.4 |
| 5.00 | 48.8 | 80.0 | 173.0 | 413.2 |
| 3.00 | 29.3 | 48.0 | 103.8 | 247.9 |
| 2.00 | 19.5 | 32.0 | 69.2 | 165.3 |
| 1.00 | 9.8 | 16.0 | 34.6 | 82.6 |

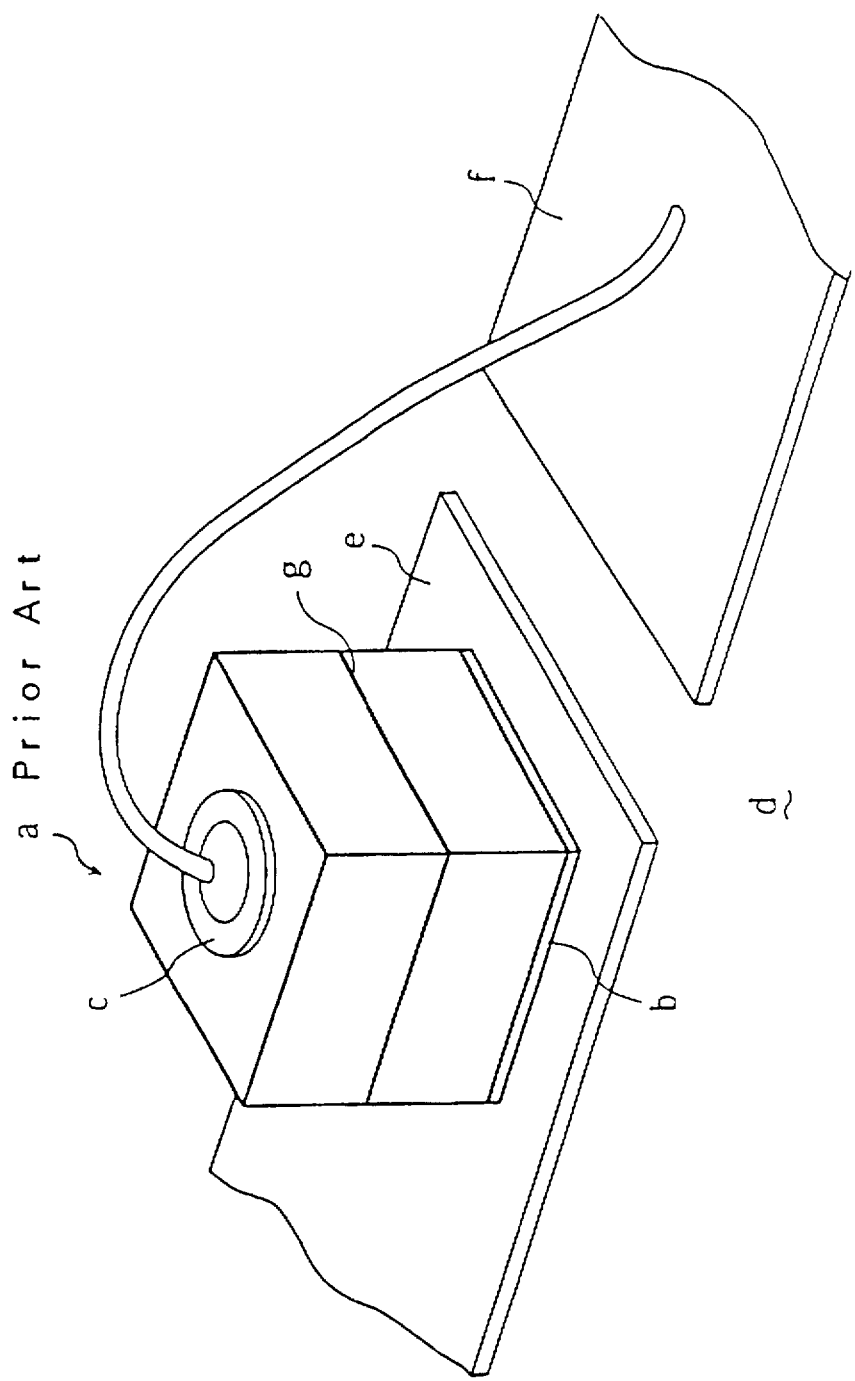

LIGHT-EMITTING DIODE CHIP AND LIGHT-EMITTING DIODE USING THE SAME

TECHNICAL FIELD

The present invention relates to a light-emitting diode chip and a light-emitting diode using the same.

BACKGROUND ART

Conventionally, a GaAsP (gallium, arsenic and phosphorus)GaAs (gallium and arsenic)-type light-emitting diode chip and a GaP (gallium and phosphorus)-type light-emitting diode chip are well-known. Typically, the chips are made in a dice-like form having a rectangular surface (or square surface in particular) perpendicular to the laminating direction of material layers, and the length of each side of the rectangular surface is set at about 0.3–0.35 mm. For convenience of explanation, the size of a dice-shaped light-emitting diode chip will be represented hereinafter by the length of each side of the rectangular surface perpendicular to the laminating direction of the material layers.

Such a light-emitting diode chip as described above is used in a manner shown in FIG. 7 of the accompanying drawings. Specifically, the bottom surface of the light-emitting diode chip designated by reference sign (a) is formed with an overall electrode (b), whereas the top surface of the chip (a) is formed with a circular electrode pad (c). The overall electrode (b) of the chip (a) is bonded via conductive adhesive for example to a first electrode (e) formed on a suitable substrate (d). The electrode pad (c) is wire-bonded to a second electrode (f) formed on the substrate (d). Thus, current passage between the overall electrode (b) and the electrode pad (c) will drive an activated layer (g) formed in the chip (a) for light emission.

The light-emitting diode chip (a) shown in FIG. 7 is formed by a method in which a wafer including an n-clad layer, an activated layer, and a p-clad layer is prepared, and the wafer is divided by a dicing cutter into separate chips at the last step of the method. The electrode pad (c) is formed by etching away unnecessary portions of a gold layer which is formed beforehand over the top surface of the wafer by vacuum evaporation or sputtering. The electrode pad (c) is formed to have dimensions which enable proper ball-bonding of a gold wire the size of 20 µm. Typically, the pad is made in the form of a circle of about 0.1 mm in diameter.

The chip size of a conventional light-emitting diode chip may be set at 0.3–0.35 mm for the purposes of that the dicing of a wafer is properly performed, that an optimum current density is obtained by a forward current of 10–20 mA which is conveniently provided by the power source of an ordinary electronic equipment, that the upper surface electrode pad does not unduly reduce the light-emitting area, and that the bonding is properly performed to the substrate by using a bonding collet.

However, the above-described conventional light-emitting diode chip or light-emitting diode using the same is not suitable as a light source for portable equipment, such as a portable telephone, which is expected to stand as long use as possible once a new battery is installed or the equipment is recharged. This is because the conventional light-emitting diode chip needs a forward current of 10–20 mA, thus requiring much power consumption and forcing the battery to discharge quickly only to make it difficult to keep the portable equipment in an operatable condition for a duration beyond a certain level.

DISCLOSURE OF THE INVENTION

It is an object of the present invention to provide a light-emitting diode chip which provides sufficient luminosity by a smaller forward current.

Another object of the present invention is to provide a light-emitting diode using the above light-emitting diode chip.

Still another object of the present invention is to provide an advantageous method of using the above light-emitting diode chip.

According to a first aspect of the present invention, there is provided an InGaAlP-type light-emitting diode chip comprising a plurality of material layers in lamination, wherein the chip includes a rectangular surface perpendicular to a laminating direction of the material layers, and each side of the rectangular surface is no greater than 0.25 mm in length.

For the purposes of economizing on electric power, the light-emitting diode chip having the above arrangement is preferably driven by a forward current of 2–5 mA for light emission, and even in this way, sufficient luminosity is obtained.

According to a preferred embodiment of the present invention, the above-mentioned surface of the light-emitting diode chip is a square each side of which is 0.14–0.25 mm in length. It is advantageous to set the length of each side of the square surface at 0.2–0.25 mm for providing sufficient luminosity.

It is known that an InGaAlP (indium, gallium, aluminum and phosphorus)-type light-emitting diode chip is about five times brighter than a conventional GaAsP-GaAs-type or GaP-type light-emitting diode chip. Therefore, theoretically, the InGaAlP-type chip only needs a forward current of ⅕ of a forward current necessary for the conventional light-emitting diode chip (25 mA for example), when the same luminosity is expected. However, reduction in forward current without taking any other measure will reduce the current density, resulting in lowered luminous efficiency. Thus, the luminosity actually obtained is less than expected. The inventor has arrived at the present invention after various trials, aiming to provide the same luminosity level as that of the conventional light-emitting diode chip by using the InGaAlP-type chip with a less amount of forward current than conventionally used.

Specifically, in the present invention, the size of the InGaAlP-type light-emitting diode is rendered no greater than 0.25 mm, which is smaller than the size of the conventional light-emitting diode chip (0.3–0.35 mm). In this way, the current density is prevented from suffering unwanted decrease due to the reduced forward current, thereby providing a predetermined luminous efficiency.

Further, the present invention is based upon the discovery of an unexpected fact as follows. Specifically, the integrating-sphere luminosity, which is a measure of the overall luminosity of a luminous body, tends to increase with the chip size. However, with an InGaAlP-type light-emitting diode, there will occur an inversive phenomenon, that is, the integrating-sphere luminosity becomes greater for a chip whose size is no greater than 0.25 mm than for a larger chip, when the forward current is no greater than about 7 mA, particularly no greater than about 5 mA. Therefore, when a forward current of no greater than about 7 mA is used for an InGaAlP-type light-emitting diode, it is advantageous that the chip size is rendered no greater than 0.25 mm, even if the aspect of ensuring a current density greater than a predetermined level is disregarded.

According to a second aspect of the present invention, there is provided a light-emitting diode comprising a substrate of an insulating material, a pair of electrodes formed on the substrate, an InGaAlP-type light emitting diode chip including a plurality of material layers in lamination and mounted on the substrate for electrical connection to one of the electrodes, a wire electrically connecting the diode chip to the other electrode, and a transparent package for sealing the diode chip together with the wire, wherein the diode chip has a rectangular surface perpendicular to a laminating direction of the material layers. Each side of the rectangular surface is no greater than 0.25 mm in length.

According to a third aspect of the present invention, there is provided a method of using an InGaAlP-type light-emitting diode chip including a plurality of material layers in lamination. The diode chip has a rectangular surface perpendicular to the laminating direction of the material layers, and each side of the rectangular surface is no greater than 0.25 mm. The method including driving the diode chip by a forward current of 2-5 mA for light emission.

Other objects, features and advantages of the present invention will be clearer from the detailed explanation described below with reference to the accompanying drawings.

BRIEF DESCRIPTION OF THE DRAWINGS

FIG. 6 is a table showing the relation between the chip size and current density for light-emitting diode chips; and FIG. 7 is a perspective view of a conventional light-emitting diode.

BEST MODE FOR CARRYING OUT THE INVENTION

Figure 1:
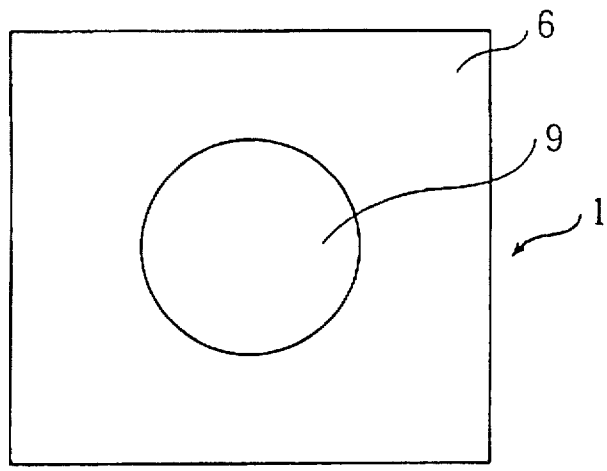
FIG. 1 is a plan view showing a light-emitting diode chip according to an embodiment of the present invention.
Figure 2:
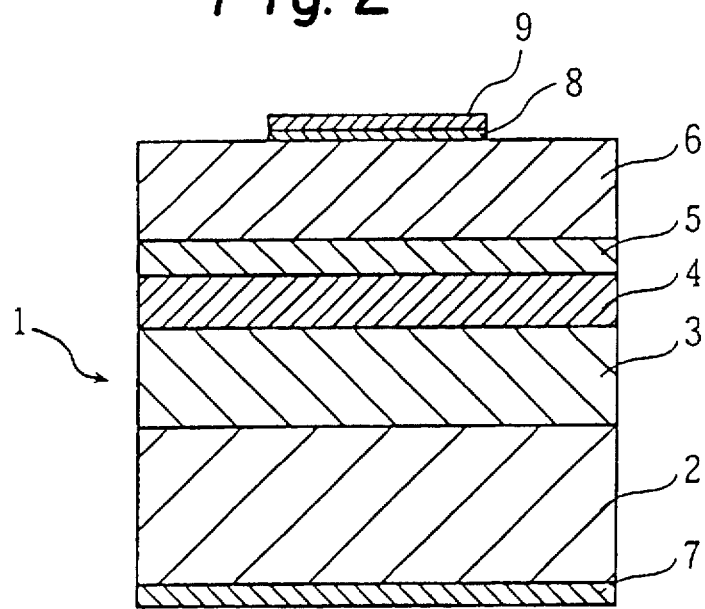
FIG. 2 is a front view of the same diode chip in vertical section.

FIGS. 1 and 2 show a light-emitting diode chip 1 according to an embodiment of the present invention. The light-emitting diode chip 1 of the embodiment is a rectangular parallelepiped having a square surface (the surface shown in FIG. 1) which is perpendicular to a thickness direction (laminating direction of material layers) defined by the direction of current flow. The length of each side of the square is equal to or less than 0.25 mm. Since the limit for performing a proper dicing of a wafer is a chip size of about 0.14 mm, each side of the square top surface of the light-emitting diode chip 1 of the present invention is rendered in a range of 0.14–0.25 mm in length.

The light-emitting diode chip 1 includes a substrate 2 made of n-GaAs (gallium and arsenic), an n-clad layer 3 made of n-InGaAlP (indium, gallium, aluminum and phosphorus) and mounted on the substrate 2, an activated layer 4 made of InGaAlP (indium, gallium, aluminum and phosphorus) and mounted on the n-clad layer 3, a p-clad layer 5 made of p-InGaAlP (indium, gallium, aluminum and phosphorus) and mounted on the activated layer 4, and a current diffusion layer 6 made of p-GaAlAs (gallium, aluminum and arsenic) and mounted on the p-clad layer 5. The substrate 2 is formed with an n-side electrode 7 (overall electrode) on a surface opposite to the surface formed with the n-clad layer 3, whereas a contact layer 8 made of p-GaAs (gallium and arsenic) is formed on the current diffusion layer 6 at the center thereof. A p-side electrode 9 (upper surface electrode) is formed on the contact layer 8. The p-side electrode 9 functions as an electrode pad for ball-bonding a metal wire and is formed into a circle having a diameter of about 0.1 mm. Similarly to the conventional way, the light-emitting diode chip 1 is produced by forming a wafer including the respective layers 2, 3, 4, 5, 6 and the electrodes 7, 9 on the master substrate, and dicing the wafer into separate chips.

Figure 3:
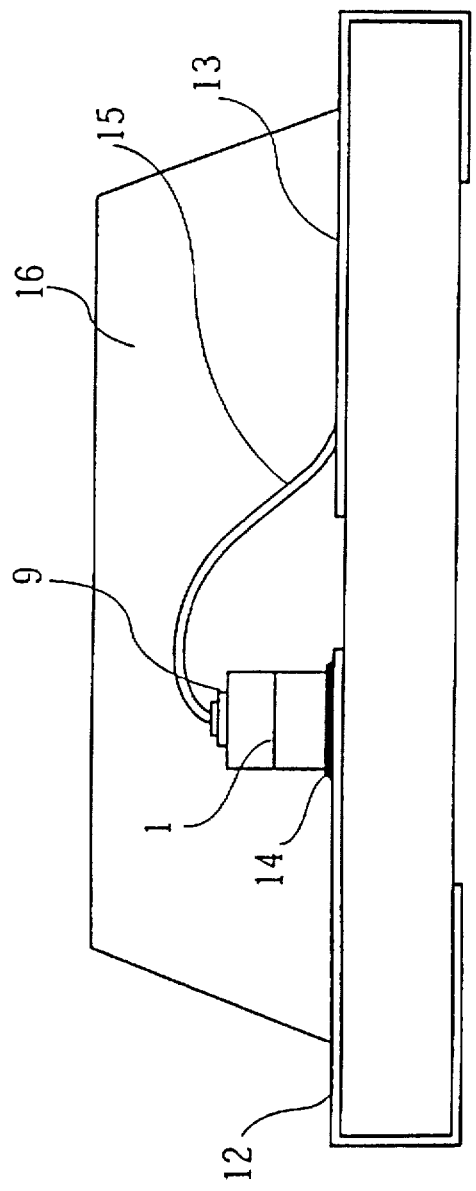
FIG. 3 is a side view schematically showing a light-emitting diode using the same light-emitting diode chip.

FIG. 3 is a side view of a light-emitting diode using the above light-emitting diode chip 1. The insulating substrate 11 is formed with a first electrode layer 12 on which the light-emitting diode chip 1 is bonded with the use of conductive adhesive 14 such as silver paste for example, while the insulating substrate 11 is also formed with a second electrode layer 13 to which the upper surface electrode 9 of the light-emitting diode chip 1 is wire-bonded by using a gold wire 15 for example. The light-emitting diode chip 1 on the substrate 11, the gold wire 15 and the like are sealed by a transparent package 16 made of epoxy resin.

In the present invention, a forward current of about 2-5 mA is passed through the light-emitting diode chip 1 from the p-side electrode 9 to the n-side electrode 7, thereby causing the activated layer 4 to emit light. For instance, when a forward current of 5 mA is passed through the light-emitting diode chip 1 having a side length of 0.2 mm, the luminance obtained is as large as that of a conventional GaAsP-GaAs or GaP light-emitting diode chip which has a side length of 0.30 mm and is driven by a forward current of 25 mA. The reason is as follows.

Figure 4:
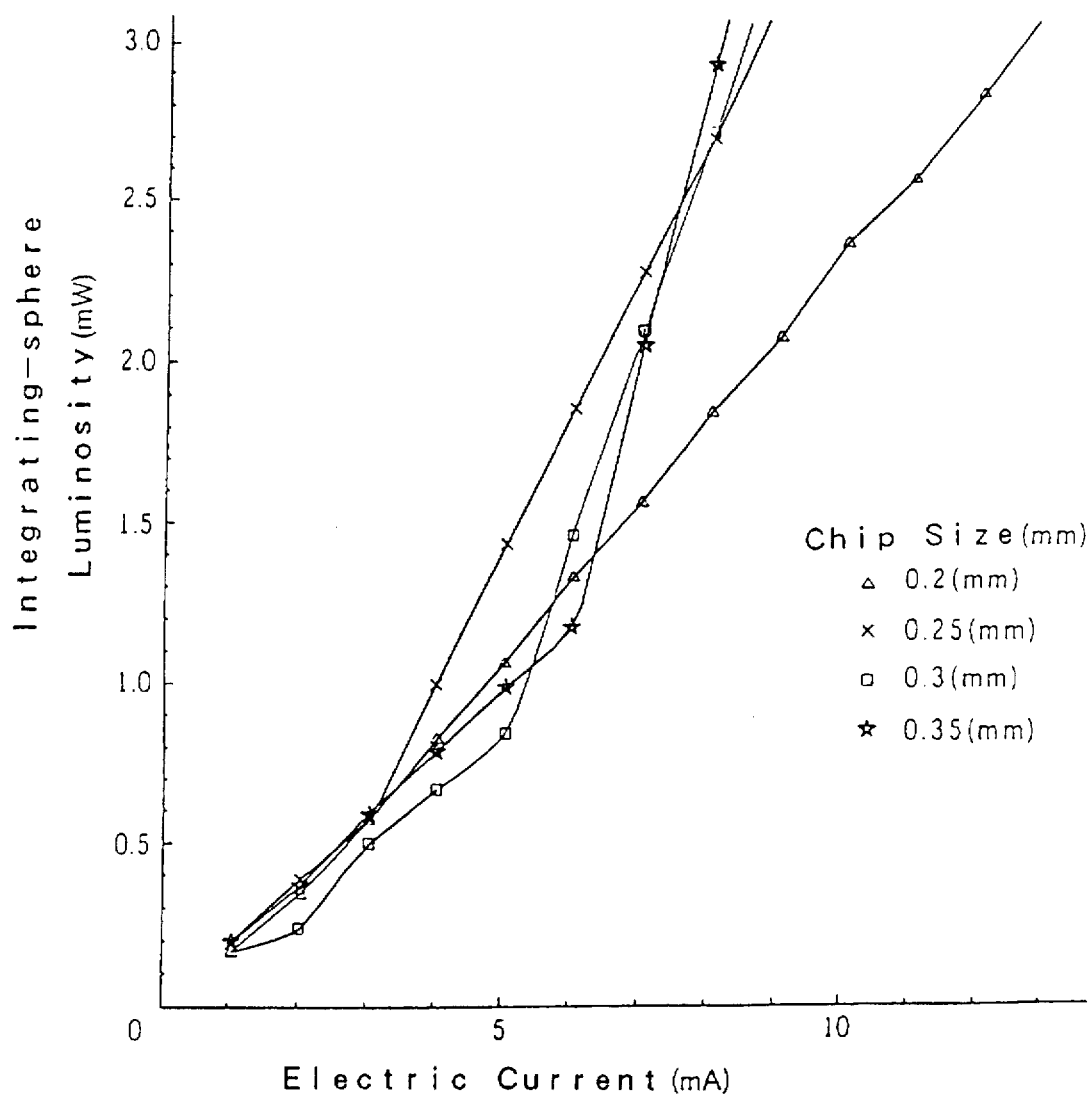
FIG. 4 is a graph showing luminous characteristics of an InGaAlP-type light-emitting diode chip.
Figure 5A:
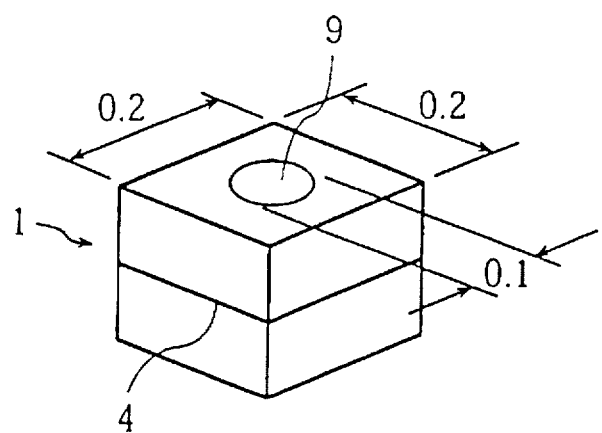
FIGS. 5a and 5b are perspective views showing the configurations of InGaAlP-type light-emitting diode chips which were used for measuring the characteristics shown in FIG. 4.
Figure 5B:
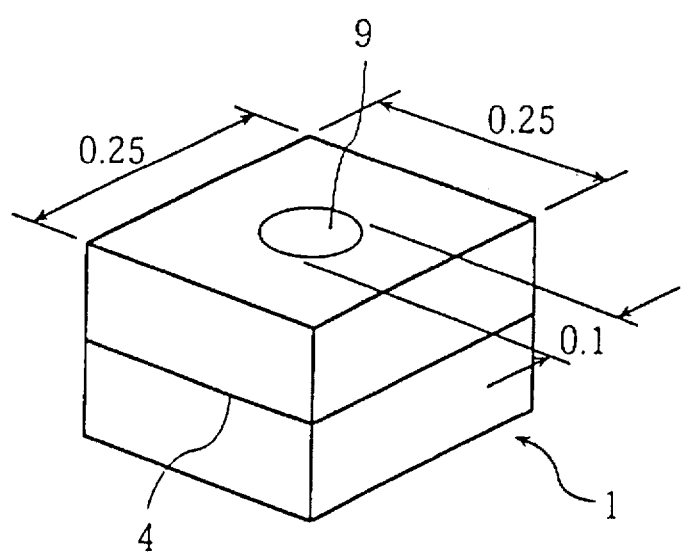

Specifically, the inventor has found the inversive phenomenon as already described, that is, when a forward current is no greater than about 7 mA, and particularly no greater than 5 mA, the integrating-sphere luminosity becomes larger for a chip whose side length is no greater than 0.25 mm than for a larger chip. The graph in FIG. 4 shows the results obtained by measuring the integrating-sphere luminosity with various forward currents for light-emitting diode chips 1 in different size (see FIGS. 5a and 5b) which have an arrangement shown in FIGS. 1-2 and whose upper surface electrode pad 9 is about 0.1 mm in diameter. As can be seen from the graph, when the forward current is greater than about 7 mA, the integrating-sphere luminosity increases as the chip size becomes larger, whereas when the forward current is no greater than 7 mA, particularly no greater than 5 mA, the integrating-sphere luminosity increases inversely to the chip size. More specifically, when the forward current is no greater than about 7 mA, the integrating-sphere luminosity is greater for a chip having a size of 0.25 mm than for a chip having a size of 0.3 mm. When the forward current is no greater than about 5 mA, the integrating-sphere luminosity is greater for a chip having a size of 0.2 mm than for a chip having a size of 0.3 mm. Therefore, it can be directly seen from the graph in FIG. 4 that the advantage of the present invention is enjoyed when the chip size is 0.2–0.25 mm. However, even when the chip size is no greater than 0.2 mm, it is presumed that a similar inversive phenomenon as described above will occur so that the advantage of the present invention may be enjoyed. However, as already described, the minimum chip size is virtually about 0.14 mm.

As mentioned above, it has found that an InGaAlP-type light-emitting diode chip according to the present invention is about five times brighter than a conventional GaAsP-GaAs light-emitting diode of the same size when driven by the same current. Therefore, in comparison with the conventional GaAsP-GaAs light-emitting diode chip or a GaP-type light-emitting diode chip through which a forward current of 25 mA is passed, it can be presumed that the same luminosity is obtained by passing a current of 5 mA, which is ⅕ of 25 mA provided for the compared chip of the same size, through the InGaAlP-type light-emitting diode chip. However, when the size of the InGaAlP-type light-emitting diode chip is reduced to 0.25 mm or 0.20 mm, it may be natural to think that the same amount of luminosity provided by the light-emitting diode chip mentioned for comparison will not be obtained (since, generally, the luminosity tends to decrease as the chip size becomes smaller).

Actually, however, even after the chip size of the InGaAlP-type light-emitting diode chip is reduced to no greater than 0.25 mm, a proper current density is obtained to provide a predetermined luminous efficiency, while the same luminosity level provided by the conventional light-emitting diode is still obtained, even with the forward current reduced to ⅕ of that of the conventional current. This is because the integrating-sphere luminosity increases as the chip size becomes smaller (see FIG. 4).

In the present invention, as described above, it is possible to obtain a proper luminosity by a remarkably small forward current of no greater than 5 mA. The minimum forward current should be set at no less than about 2 mA since it is needed to provide a proper current density suitable for obtaining a standard luminous efficiency. Specifically, FIG. 6 shows the relation between the chip size and the current density. Conventionally, a forward current of no less than 5–10 mA is used for a light-emitting diode chip whose side is about 0.3 mm, resulting in a current density of no less than about 50 (mA/mm$^2$). This condition applies to light-emitting diodes in general. Taking these into consideration, since the minimum size of a light-emitting diode chip of the present invention is virtually 0.14 mm, a forward current of 1 mA may possibly fail to provide a proper current density needed to drive a light-emitting diode chip of the present invention for light emission with a predetermined efficiency. Thus, in the present invention, it is preferable to use a forward current of at least 2 mA.

As described above, a light-emitting diode chip or a light-emitting diode using the same according to the present invention can be used as a light source in various portable electronic equipment powered by batteries such as a portable telephone, a beeper, a video camera working integrally with a videotape recorder and the like. Thus, the power consumed for lighting is advantageously reduced, thereby enabling a longer use of the above-mentioned portable equipment. Particularly for the portable telephone, a small forward current of about 2–5 mA can give sufficient luminosity to the back-lighting for a liquid crystal display or key switches incorporating an illumination device and used for various operations.

In the above embodiment, a single light-emitting diode chip 1 is provided on the insulating substrate 11. However, it is also possible to mount a plurality of light-emitting diode chips 1 on the substrates 11 for back-lighting the liquid crystal display and a plurality of key switches with an illumination device so that a desired luminosity is obtained.

Further, thought a light-emitting diode chip 1 with a DH-structure (double hetero structure) including a current diffusion layer 6 is used in the above embodiment, this should not be regarded as a required limitation for the light-emitting diode 1. The present invention is applicable to various InGaAlP (indium, gallium, aluminum and phosphorus)-type light-emitting diode chips with a DH structure including no current diffusion layer 6, or with an SH structure (single hetero structure) or the like.

Further, in the above embodiment, the surface configuration (the configuration of the surface perpendicular to the laminating direction of the material layers) of the light-emitting diode chip 1 is square. Generally, a chip with a square surface is preferable since a uniform current density is easily realized in the chip due to the positional relation with the upper surface electrode pad 9. However, the present invention is applicable to a light-emitting diode chip having rectangular surfaces. In such an instance, the length of the longer sides should be no greater than 0.25 mm. The practical minimum length of each side is about 0.14 mm for enabling proper dicing of the wafer.

We claim:

1. An InGaAlP-type light-emitting diode chip comprising a plurality of material layers in lamination, wherein the chip includes a rectangular surface perpendicular to a laminating direction of the material layers, each side of the rectangular surface being no greater than 0.25 mm in length.

2. The light-emitting diode chip according to claim 1, wherein the chip is driven by a forward current of 2–5 mA for light emission.

3. The light-emitting diode chip according to claim 1, wherein said surface is square.

4. The light-emitting diode chip according to claim 1, wherein each side of said surface is 0.14–0.25 mm in length.

5. The light-emitting diode chip according to claim 1, wherein each side of said surface is 0.2–0.25 mm in length.

6. A light-emitting diode comprising a substrate of an insulating material, a pair of electrodes formed on the substrate, an InGaAlP-type light emitting diode chip including a plurality of material layers in lamination and mounted on the substrate for electrical connection to one of the electrodes, a wire electrically connecting the diode chip to the other electrode, and a transparent package for sealing the diode chip together with the wire, wherein the diode chip has a rectangular surface perpendicular to a laminating direction of the material layers, each side of the rectangular surface being no greater than 0.25 mm.

7. The light-emitting diode according to claim 6, wherein the diode is driven by a forward current of 2–5 mA for light emission.

8. The light-emitting diode according to claim 6, wherein said surface is square.

9. The light-emitting diode according to claim 6, wherein each side of the surface is 0.14–0.25 mm in length.

10. The light-emitting diode according to claim 6, wherein each side of the surface is 0.2–0.25 mm in length.

11. A method of using an InGaAlP-type light-emitting diode chip including a plurality of material layers in lamination, the diode chip having a rectangular surface perpendicular to the laminating direction of the material layers, each side of the rectangular surface being no greater than 0.25 mm, the method comprising driving the diode chip by a forward current of 2–5 mA for light emission.

* * * * *